(12) United States Patent
Dai et al.

(10) Patent No.: US 7,489,754 B2
(45) Date of Patent: Feb. 10, 2009

(54) FREQUENCY-LOCK DETECTOR

(75) Inventors: Xingdong Dai, Bethlehem, PA (US);
Max J. Olsen, Mertztown, PA (US);
Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 766 days.

(21) Appl. No.: 11/053,365

(22) Filed: Feb. 8, 2005

(65) Prior Publication Data
US 2006/0176992 A1   Aug. 10, 2006

(51) Int. Cl.
*H04L 7/02* (2006.01)
(52) U.S. Cl. ....................................... 375/360
(58) Field of Classification Search ............ 375/360, 375/354, 359; 327/141, 145
See application file for complete search history.

(56) References Cited

U.S. PATENT DOCUMENTS

| | | | | |
|---|---|---|---|---|
| 4,240,117 A | * | 12/1980 | Wellendorf et al. | 358/296 |
| 5,572,721 A | * | 11/1996 | Rostamian | 713/500 |
| 5,757,868 A | * | 5/1998 | Kelton et al. | 375/360 |
| 2004/0228424 A1 | * | 11/2004 | Baldwin et al. | 375/343 |

* cited by examiner

*Primary Examiner*—David C Payne
*Assistant Examiner*—Leon-Viet Q Nguyen
(74) *Attorney, Agent, or Firm*—Mendelsohn & Associates, P.C.; Yuri Gruzdkov; Steve Mendelsohn

(57) ABSTRACT

A frequency-lock detector (FLD) adapted to register more than one target count per period of a target clock signal to generate a count value related to a frequency difference between the target clock signal and a reference clock signal. In various embodiments of the invention, this count registration is implemented by multiplying the target clock signal, discerning two or more phases of a signal, and/or organizing a count pipeline. In a representative embodiment, an FLD of the invention has a counter circuit and a control circuit. The counter circuit has (i) a frequency multiplier adapted to multiply the frequency of the target clock signal to generate a multiplied signal, (ii) two target counters adapted to register counts based on occurrences of two different phases of the accelerated signal to generate two auxiliary numbers, and (iii) a multiplexer adapted to select an appropriate one of the auxiliary numbers as the count value related to the frequency difference. The control circuit has a reference counter adapted to control, based on the reference clock signal, the count registration in the target counters and the value selection in the multiplexer.

17 Claims, 3 Drawing Sheets

FREQUENCY-LOCK DETECTOR

BACKGROUND OF THE INVENTION

1. Field of the Invention

The present invention relates to communication and/or computer systems and, more specifically, to circuits for detection and recovery from loss of frequency lock between two system clocks.

2. Description of the Related Art

FIG. 1 shows a block diagram of a prior-art frequency-lock detector (FLD) 100. FLD 100 receives two clock signals, a reference clock signal 110 and a target clock signal 120, and generates a lock-indicator signal 150, which indicates whether the frequency difference between the received clock signals is within a selected tolerance interval. For example, if the frequency difference is within the tolerance interval, then lock-indicator signal 150 is a binary zero. Alternatively, if the frequency difference is outside the tolerance interval, then lock-indicator signal 150 is a binary one. Based on lock-indicator signal 150, a corrective action can be taken, e.g., to adjust the frequency of target clock signal 120, thereby substantially synchronizing that clock signal with reference clock signal 110.

FLD 100 has two equal-limit counters, a reference counter 112 and a target counter 122 clocked by reference clock signal 110 and target clock signal 120, respectively. More specifically, reference counter 112 counts periods (e.g., pulses) in reference clock signal 110 and, based on the count, generates a control signal 114 applied to target counter 122. Similarly, target counter 122 counts pulses in target clock signal 120. When reference counter 112 has counted a selected number of periods (hereafter referred to as a reset-count value), control signal 114 configures target counter 122 to stop its count and to output the count result via an output signal 124. In addition, both counters 112 and 122 are reset to their respective start values and resume counting periods in clock signals 110 and 120, respectively.

Signal 124 having the count result of target counter 122 is applied to comparators 130*a-b* configured to compare that count result with upper and lower bounds, respectively, corresponding to the tolerance interval. More specifically, signal 124 is applied to the negative input of comparator 130*a*, while the positive input of that comparator receives an upper-bound signal 126 having the upper-bound value. In addition, signal 124 is applied to the positive input of comparator 130*b*, while the negative input of that comparator receives a lower-bound signal 128 having the lower-bound value.

Each of comparators 130*a-b* is designed such that the comparator's output is (i) a binary zero, if the value corresponding to the positive input is greater than the value corresponding to the negative input, and (ii) a binary one, if the value corresponding to the positive input is smaller than or equal to the value corresponding to the negative input. Thus, if the count result provided by signal 124 falls outside the count interval defined by signals 126 and 128, then at least one of comparators 130*a-b* generates a binary one. In contrast, if the count result provided by signal 124 is within the count interval, then both comparators 130*a-b* generate binary zeros.

The output signals generated by comparators 130*a-b* are then applied to a logic-OR gate 140, which generates lock-indicator signal 150. Therefore, if one of comparators 130*a-b* generates a binary one, then gate 140 also generates a binary one, thereby indicating that target clock signal 120 is out of frequency lock with reference clock signal 110. Alternatively, if both comparators 130*a-b* generate binary zeros, then gate 140 also generates a binary zero, thereby indicating that target clock signal 120 is substantially frequency-locked with reference clock signal 110.

The reset-count value of reference counter 112 and the width of the count interval established by signals 126 and 128 control the accuracy with which FLD 100 determines the absence or presence of frequency lock between clock signals 110 and 120. For example, if the reset-count value is 10,000 and the width of the count interval is set to 2 counts (e.g., by setting the lower- and upper-bound values to 9,999 and 10,001, respectively), the accuracy of the frequency-lock determination is ±100 ppm. On the other hand, if the reset-count value is reduced to 2,000, the same width of 2 counts of the count interval (e.g., obtained by setting the lower- and upper-bound values to 1,999 and 2,001, respectively) results in the accuracy of the frequency-lock determination of only ±500 ppm.

It is clear from these examples that, to provide a desired accuracy for the frequency-lock determination, FLD 100 has to use at least a certain minimum reset-count value related to that accuracy in reference counter 112. For example, as already indicated above, to provide an accuracy of about ±100 ppm, FLD 100 has to use a reset-count value of at least about 10,000. Due to this limitation, the amount of time (hereafter referred to as latency time) taken by FLD 100 to generate an initial value for lock-indicator signal 150 is at least about a period of reference clock signal 110 multiplied by the minimum possible reset-count value. For example, if reference clock signal 110 has a period of about 10 ns (a frequency of about 100 MHz), latency time corresponding to an accuracy of ±100 ppm is at least about 100 μs. Furthermore, latency time of FLD 100 also affects the number of updates of lock-indicator signal 150 that the FLD can generate per unit time (hereafter referred to as throughput rate). In the above example of 100-MHz reference clock signal 110 and 100-ppm accuracy of the frequency-lock determination, FLD 100 has a throughput rate of about 10,000 updates per second.

For many applications, e.g., data rate negotiation between a transmitter and a receiver, it is often desirable to have a relatively short latency time and/or relatively high throughput rate while, at the same time, satisfying a relatively stringent accuracy constraint for the frequency-lock determination. It is therefore desirable to have an FLD having improved characteristics compared to those of FLD 100.

SUMMARY OF THE INVENTION

Problems in the prior art are addressed, in accordance with the principles of the present invention, by a frequency-lock detector (FLD) adapted to register more than one target count per period of a target clock signal to generate a count value related to a frequency difference between the target clock signal and a reference clock signal. In various embodiments of the invention, this count registration is implemented by multiplying the target clock signal, discerning two or more phases of a signal, and/or organizing a count pipeline. In a representative embodiment, an FLD of the invention has a counter circuit and a control circuit. The counter circuit has (i) a frequency multiplier adapted to multiply the frequency of the target clock signal to generate a multiplied signal, (ii) two target counters adapted to register counts based on occurrences of two different phases of the accelerated signal to generate two auxiliary numbers, and (iii) a multiplexer adapted to select an appropriate one of the auxiliary numbers as the count value related to the frequency difference. The control circuit has a reference counter adapted to control, based on the reference clock signal, the count registration in the target counters and the value selection in the multiplexer. Advantageously, an FLD of the invention improves latency time and/or throughput rate with respect to those quantities in prior-art FLDs.

According to one embodiment, the present invention is an integrated circuit, comprising: a counter circuit adapted to register counts based on a target signal to generate a count value; and a control circuit adapted to control the generation of the count value in the counter circuit based on a reference signal, wherein: the counter circuit is adapted to register more than one count per period of the target signal; and the generated count value is related to a frequency difference between the target and reference signals.

According to another embodiment, the present invention is a method of comparing signal frequencies, comprising: registering counts based on a target signal to generate a count value, wherein more than one count is registered per period of the target signal; and controlling the generation of the count value based on a reference signal, wherein the generated count value is related to a frequency difference between the target and reference signals.

According to yet another embodiment, the present invention is an integrated circuit, comprising: means for registering counts based on a target signal to generate a count value, wherein more than one count is registered per period of the target signal; and means for controlling the generation of the count value based on a reference signal, wherein the generated count value is related to a frequency difference between the target and reference signals.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1:
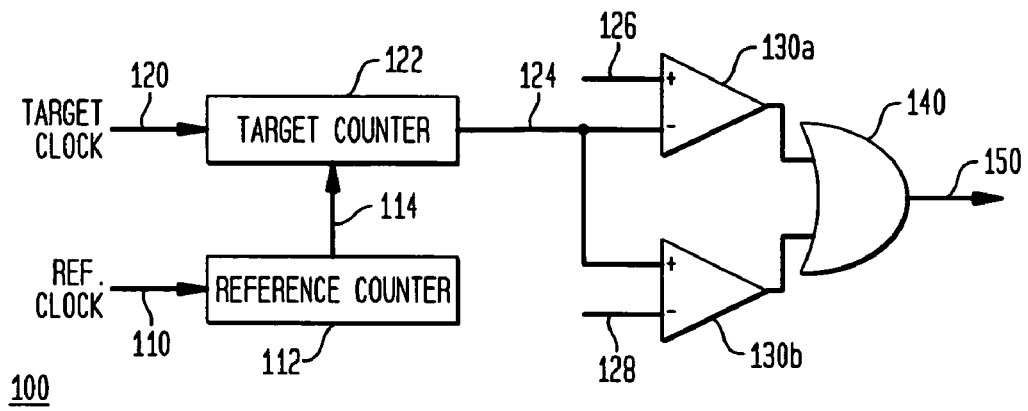
FIG. 1 shows a block diagram of a prior-art frequency-lock detector (FLD)

The relatively long latency time and relatively low throughput rate of frequency-lock detector (FLD) 100 (FIG. 1) can be attributed to the fact that this FLD generates one target count per period of target clock signal 120. As such, embodiments of the present invention improve latency time and/or throughput rate by providing an FLD capable of generating more than one (e.g., two or more) target counts per period of the target clock signal. Two different approaches to the generation of target counts in accordance with this principle are realized in the embodiments described below. The first approach is to increase an effective time resolution for the target-count generation to a level above the level defined by the duration of a target-clock period. For example, (i) controlled acceleration (frequency multiplication) of the target clock signal and/or (ii) use of target counters configured to count phases rather than periods of the clock signal can improve the effective time resolution. The first approach improves both latency time and throughput rate with respect to those quantities in FLD 100, and FLD circuits embodying this approach are described in the context of FIGS. 2-4. A second approach is to register several redundant target counts per target clock period and use these counts to organize a target-count pipeline, e.g., by means of staggered target counters. The second approach improves throughput rate with respect to that in FLD 100, and a representative FLD circuit embodying this approach is described in the context of FIG. 5.

Figure 2:
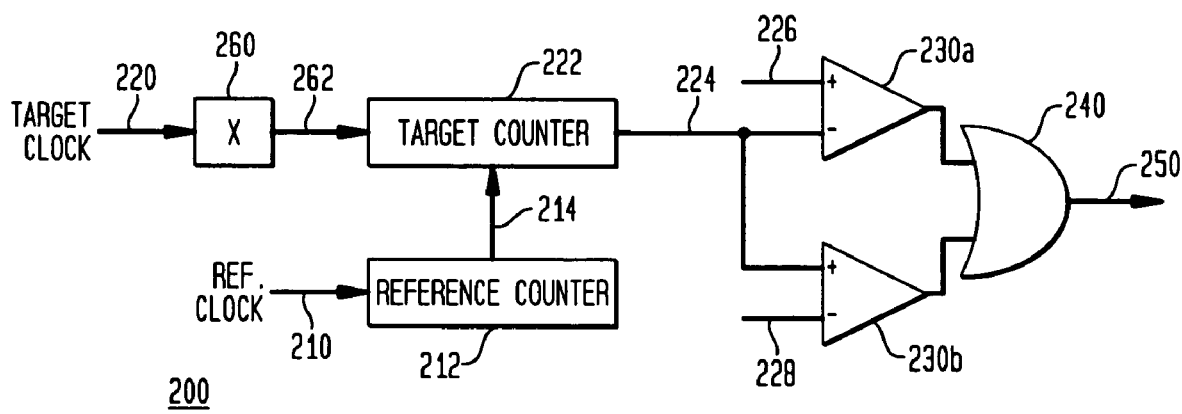
FIG. 2 shows a block diagram of an FLD according to one embodiment of the invention.

FIG. 2 shows a block diagram of an FLD 200 according to one embodiment of the invention. Similar to FLD 100 (FIG. 1), FLD 200 receives two clock signals, a reference clock signal 210 and a target clock signal 220, and generates a lock-indicator signal 250, which indicates whether the frequency difference between the received clock signals is within a selected tolerance interval. Based on lock-indicator signal 250, a corrective action can be taken, e.g., to adjust the frequency of target clock signal 220 such that the target clock signal is substantially synchronized with reference clock signal 210. However, one difference between FLD 100 and FLD 200 is that the latter has a frequency multiplier 260, which controllably accelerates the target clock signal.

In one embodiment, frequency multiplier 260 is based on a conventional phase-locked loop (PLL) circuit, which receives target clock signal 220 and increases its frequency in accordance with a selected multiplication factor to generate an accelerated clock signal 262. For example, if target clock signal 220 has a frequency of 100 MHz and the multiplication factor in frequency multiplier 260 is set to 2.0, then accelerated clock signal 262 has a frequency of 200 MHz. Frequency multiplier 260 can be designed to have a fixed or programmable multiplication factor as known in the art.

Subsequent processing of accelerated clock signal 262 implemented in FLD 200 is analogous to the processing of target clock signal 120 implemented in FLD 100. More specifically, a reference counter 212 counts periods (e.g., pulses) in reference clock signal 210 and, based on the count, generates a control signal 214 applied to a target counter 222, which counts periods in accelerated clock signal 262. When reference counter 212 has counted a number of periods equal to a reset-count value, control signal 214 configures target counter 222 to stop its count and to output the count result via an output signal 224. In addition, both counters 212 and 222 are reset to their respective start values and resume counting periods in clock signals 210 and 262, respectively. However, one difference between FLD 100 and FLD 200 is that, because accelerated clock signal 262 runs at a higher frequency than reference clock signal 210, counters 212 and 222 in the latter FLD no longer need to have substantially equal limits as counters 112 and 122 in the former FLD. Herein, the term "counter limit" means the maximum number of counts that can be counted by the counter before it overflows. For example, a 14-bit counter has a counter limit of 16,384 counts. In general, reference counter 212 can be designed to have a smaller limit than that of target counter 222 by a factor equal to about a minimum multiplication factor used in frequency multiplier 260. For example, if frequency multiplier 260 is implemented as a fixed frequency multiplier having a multiplication factor of about 2.0, then reference counter 212 can have a limit that is about two times smaller than the limit of target counter 222. Hence, if target counter 222 is a 14-bit counter, reference counter 212 can be a 13-bit counter.

Signal 224 having the count result of target counter 222 is applied to comparators 230a-b, which are analogous to comparators 130a-b (FIG. 1), respectively. More specifically, signal 224 is applied to the negative input of comparator 230a, while the positive input of that comparator receives an upper-bound signal 226 having the upper-bound value of the count interval. In addition, signal 224 is applied to the positive input of comparator 230b, while the negative input of that comparator receives a lower-bound signal 228 having the lower-bound value of the count interval. If the count result provided by signal 224 falls outside the count interval defined by signals 226 and 228, then one of comparators 230a-b generates a binary one. Similarly, if the count result provided by signal 224 is within the count interval, then both comparators 230a-b generate binary zeros. The output signals generated by comparators 230a-b are then applied to a logic-OR gate 240, which generates lock-indicator signal 250. Therefore, if one of comparators 230a-b generates a binary one, then gate 240 also generates a binary one, thereby indicating that target clock signal 220 is out of frequency lock with reference clock signal 210. Alternatively, if both comparators 230a-b generate binary zeros, then gate 240 also generates a binary zero, thereby indicating that target clock signal 220 is substantially frequency-locked with reference clock signal 210.

Suppose that FLD 200 needs to be configured to meet an accuracy constraint of about ±100 ppm for the frequency-lock determination between clock signals 210 and 220. Then, the following exemplary settings can be used: (1) a multiplication factor in frequency multiplier 260 of about 2.0; (2) a reset-count value in reference counter 212 of about 5,000; (3) an upper-bound value provided by signal 226 of about 10,001; and (4) a lower-bound value provided by signal 228 of about 9,999. If reference clock signal 210 has a frequency of about 100 MHz, latency time in FLD 200 corresponding to these settings is only about 50 μs. Advantageously, this is a factor-of-two reduction compared to the latency time in FLD 100 configured to operate under a similar accuracy constraint. One skilled in the art will appreciate that, in general, FLD 200 can provide both latency-time reduction and throughput-rate increase in proportion to the multiplication factor used in frequency multiplier 260.

Figure 3:
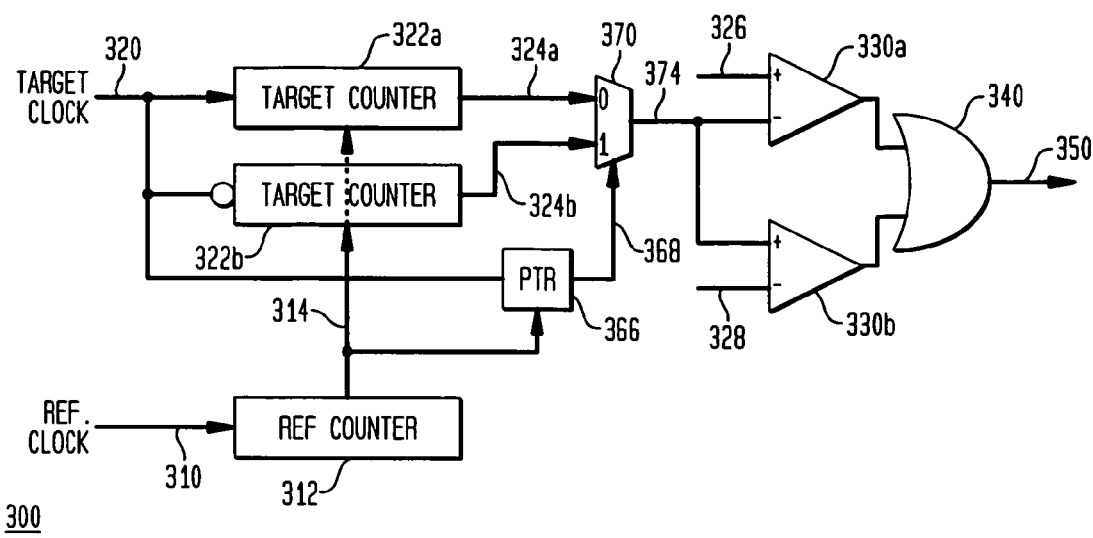
FIG. 3 shows a block diagram of an FLD according to another embodiment of the invention.

FIG. 3 shows a block diagram of an FLD 300 according to another embodiment of the invention. Similar to FLD 100 (FIG. 1), FLD 300 receives two clock signals, a reference clock signal 310 and a target clock signal 320, and generates a lock-indicator signal 350, which indicates whether the frequency difference between the received clock signals is within a selected tolerance interval. Based on lock-indicator signal 350, a corrective action can be taken, e.g., to substantially synchronize target clock signal 320 with reference clock signal 310. However, one difference between FLDs 100 and 300 is that the latter FLD has a pair of target counters 322a-b, which effectively double the time resolution for the target-count generation compared to that available in the former FLD.

More specifically, operation of FLD 300 is based on an observation that a typical clock signal is at least bi-phased. For example, a clock signal having a train of pulses has, for each period, a first phase corresponding to a rising pulse edge (e.g., a low-to-high transition) and a second phase corresponding to a falling pulse edge (e.g., a high-to-low transition). Hence, FLD 300 decreases latency time by counting clock phases in target clock signal 320 rather than clock periods, as is the case in FLD 100.

In one embodiment, target counter 322a is a counter adapted to increment its count when it detects a rising edge of a pulse in target clock signal 320. As such, target counter 322a is adapted to count occurrences of a first phase in target clock signal 320. A representative count sequence generated by target counter 322a via an output signal 324a may be as follows: 0, 1, 3, 5, 7, . . . , where "0" is the counter's start value and the subsequent values are odd integers. Similarly, target counter 322b is a counter adapted to increment its count when it detects a falling edge of a pulse in target clock signal 320. As such, target counter 322b is adapted to count occurrences of a second phase in target clock signal 320. To detect a falling edge, target counter 322b first inverts clock signal 320 and then detects the falling edge by detecting a low-to-high transition in the inverted clock signal. A representative count sequence generated by target counter 322b via an output signal 324b may be as follows: 0, 2, 4, 6, 8, . . . , where "0" is the counter's start value and the subsequent values are even integers.

A reference counter 312 in FLD 300 is analogous to reference counter 212 in FLD 200 (FIG. 2). As such, reference counter 312 counts periods in reference clock signal 310 and, based on the count, generates a control signal 314, which is applied to target counters 322a-b and a pointer (ptr) 366. Pointer 366 is a circuit adapted to generate a control signal 368, which indicates what phase (e.g., first or second) in target clock signal 320 has occurred most recently, thereby pointing at the target counter that has acquired the most recent increment. For example, if a first phase has occurred most recently, then control signal 368 is a digital zero, which indicates that target counter 322a has acquired the most recent increment. Alternatively, if a second phase has occurred most recently, control signal 368 is a digital one, which indicates that target counter 322b has acquired the most recent increment.

Control signal 368 is applied to a multiplexer (MUX) 370, which receives at its input ports, labeled 0 and 1 in FIG. 3, signals 324a-b from target counters 322a-b, respectively. When reference counter 312 has counted a number of periods in reference clock signal 310 equal to a reset-count value, control signal 314 configures pointer 366 to apply control signal 368 to MUX 370. Based on control signal 368, MUX 370 selects an appropriate one of signals 324a-b applied to its input ports and outputs the selected signal as an output signal 374. For example, if control signal 368 is a digital zero, then MUX 370 selects the signal applied to input port "0" (i.e., signal 324a generated by target counter 322a). Alternatively, if control signal 368 is a digital one, then MUX 370 selects the signal applied to input port "1" (i.e., signal 324b generated by target counter 322b). Control signal 314 further causes target counters 322a-b to reset to their respective start values and resume counting clock phases in target clock signal 320. Reference counter 312 is also reset and resumes counting periods in reference clock signal 310.

Subsequent processing of signal 374 implemented in FLD 300 is analogous to the processing of signal 224 implemented in FLD 200. More specifically, signal 374 having the count result of the selected one of target counters 322a-b is applied to the negative input of a comparator 330a, while the positive input of that comparator receives an upper-bound signal 326 having the upper-bound value of the count interval. In addition, signal 374 is applied to the positive input of a comparator 330b, while the negative input of that comparator receives a lower-bound signal 328 having the lower-bound value of the count interval. If the count result provided by signal 374 falls outside the count interval defined by signals 326 and 328, then one of comparators 330a-b generates a binary one. Alternatively, if the count result provided by signal 374 is within the count interval, then both comparators 330a-b generate binary zeros. The output signals generated by comparators 330a-b are then applied to a logic-OR gate 340, which generates lock-indicator signal 350.

Suppose that FLD 300 needs to be configured to meet an accuracy constraint of about ±100 ppm for the frequency-lock determination between clock signals 310 and 320. Then, the following exemplary settings can be used: (1) a reset-count value in reference counter 312 of about 5,000; (2) an upper-bound value provided by signal 326 of about 10,001; and (3) a lower-bound value provided by signal 328 of about 9,999. If reference clock signal 310 has a frequency of about 100 MHz, latency time in FLD 300 corresponding to these settings is only about 50 µs. Advantageously, this is a factor-of-two reduction compared to the latency time in FLD 100 configured to operate under a similar accuracy constraint. One skilled in the art will appreciate that, in general, an FLD having three or more target counters adapted to count a corresponding number of clock phases in the target clock signal can provide both latency-time reduction and throughput-rate increase compared to those quantities in FLD 100 in proportion to the number of utilized target counters (or counted clock phases).

Figure 4:
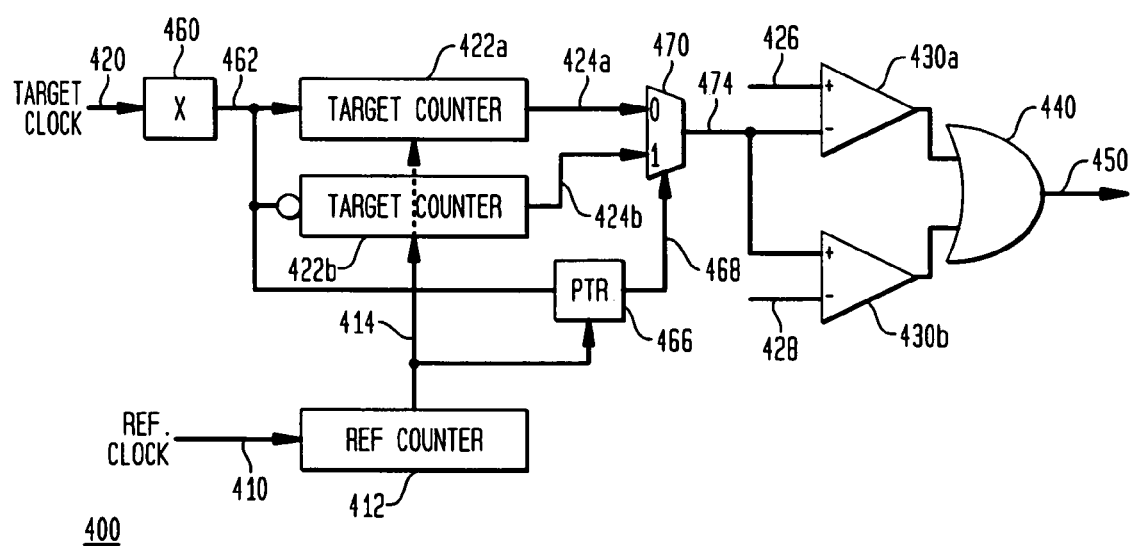
FIG. 4 shows a block diagram of an FLD according to yet another embodiment of the invention.

FIG. 4 shows a block diagram of an FLD 400 according to yet another embodiment of the invention. FLD 400 receives two clock signals, a reference clock signal 410 and a target clock signal 420, and generates a lock-indicator signal 450, which indicates whether the frequency difference between the received clock signals is within a selected tolerance interval. FLD 400 reduces latency time and throughput rate compared to those quantities in any one of the above-discussed FLDs by incorporating both: (i) a frequency multiplier 460 analogous to frequency multiplier 260 of FLD 200 (FIG. 2) and (ii) a pair of target counters 422a-b analogous to the pair of target counters 322a-b of FLD 300 (FIG. 3).

Frequency multiplier 460 receives target clock signal 420 and increases its frequency in accordance with a selected multiplication factor to generate an accelerated clock signal 462. Subsequent processing of accelerated clock signal 462 implemented in FLD 400 is analogous to the processing of target clock signal 320 implemented in FLD 300, and analogous circuit elements in FIGS. 3 and 4 are marked with labels having the same last two digits. However, one difference between FLDs 300 and 400 is that, due to the presence of frequency multiplier 460, reference counter 412 in the latter FLD can have a reduced limit compared to that of reference counter 312 in the former FLD.

Suppose that FLD 400 needs to be configured to meet an accuracy constraint of about ±100 ppm for the frequency-lock determination between clock signals 410 and 420. Then, the following exemplary settings can be used: (1) a multiplication factor in frequency multiplier 460 of about 2.0; (2) a reset-count value in reference counter 412 of about 2,500; (2) an upper-bound value provided by signal 426 of about 10,001; and (3) a lower-bound value provided by signal 428 of about 9,999. If reference clock signal 410 has a frequency of about 100 MHz, latency time and throughput rate in FLD 400 corresponding to these settings are about 25 µs and 40,000 updates per second, respectively. Advantageously, for each quantity, FLD 400 provides a factor-of-four improvement with respect to FLD 100 configured to operate under a similar accuracy constraint. One skilled in the art will appreciate that the factor of four is a product of (i) a factor of two originating from the use of frequency multiplier 460 and (ii) another factor of two originating from the use of two target counters 422a-b.

Figure 5:
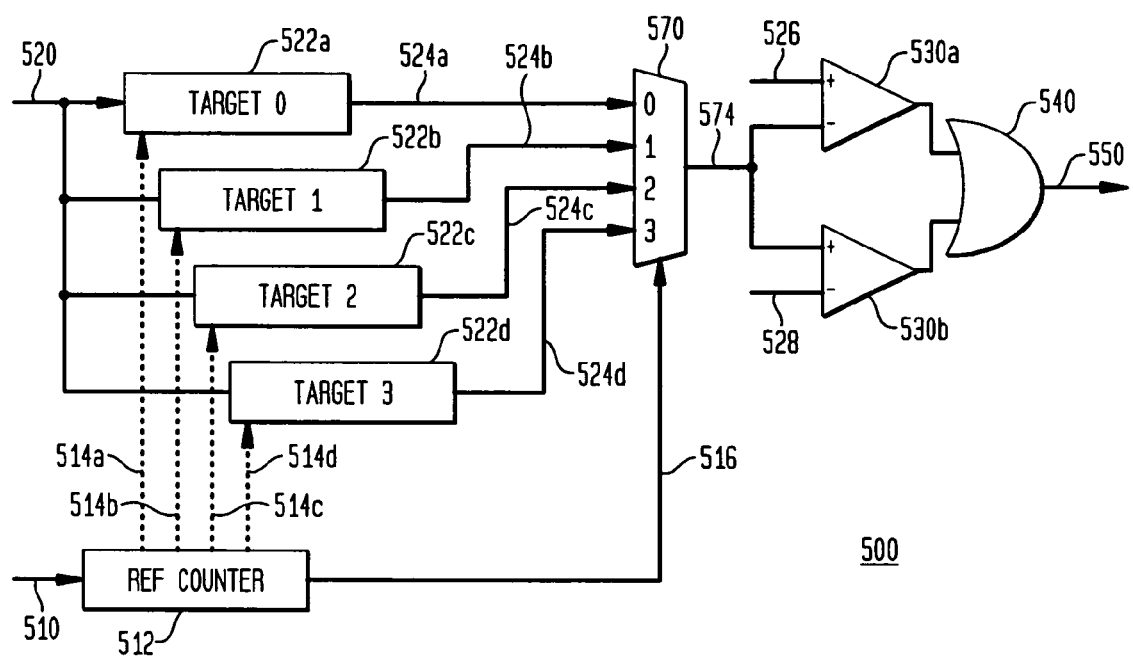
FIG. 5 shows a block diagram of an FLD according to still another embodiment of the invention.

FIG. 5 shows a block diagram of a frequency-lock detector (FLD) 500 according to yet another embodiment of the invention. Similar to FLD 100 (FIG. 1), FLD 500 receives two clock signals, a reference clock signal 510 and a target clock signal 520, and generates a lock-indicator signal 550, which indicates whether the frequency difference between the received clock signals is within a selected tolerance interval. However, one difference between FLD 100 and FLD 500 is that the latter has multiple, staggered target counters 522 compared to just one target counter 122 in the former. As further shown below, the presence of these multiple, staggered target counters significantly increases the throughput rate in FLD 500 compared to that in FLD 100.

In one embodiment, FLD 500 has (i) four target counters 522a-d, each receiving a copy of target clock signal 520, and (ii) a reference counter 512 receiving reference clock signal 510. Reference counter 512 counts periods (e.g., pulses) in reference clock signal 510 and, based on the count, generates control signals 514a-d applied to target counters 522a-d, respectively. Similarly, each of target counters 522a-d counts periods (e.g., pulses) in target clock signal 520.

At start-up, all target counters 522a-d are reset and start counting periods in target clock signal 520. When reference counter 512 has counted one quarter of the reset-count value, control signal 514b resets target counter 522b and restarts its count. When reference counter 512 has counted two quarters of the reset-count value, control signal 514c resets target counter 522c and restarts its count. Finally, when reference counter 512 has counted three quarters of the reset-count value, control signal 514d resets target counter 522d and restarts its count. As a result, after these three restarts, the running counts in target counters 522a-d are separated from one another by substantially one quarter of the reset-count value, thereby forming an arithmetic progression and establishing a staggered counter configuration.

After the staggered counter configuration is established, the counters operate as follows. When reference counter 512 has counted the reset-count value, control signal 514a configures target counter 522a to stop its count and to output the count result via an output signal 524a. In addition, both counters 512 and 522a are reset to their respective start values and resume counting periods in clock signals 510 and 520, respectively. When reference counter 512 has counted one quarter of the reset-count value, control signal 514b configures target counter 522b to stop its count and to output the count result via an output signal 524b. In addition, target counter 522b is reset to its start value and resumes counting periods in target clock signal 520. When reference counter 512 has counted two quarters of the reset-count value, control signal 514c configures target counter 522c to stop its count and to output the count result via an output signal 524c. In addition, target counter 522c is reset to its start value and resumes counting periods in target clock signal 520. When reference counter 512 has counted three quarters of the reset-count value, control signal 514d configures target counter 522d to stop its count and to output the count result via an output signal 524d. In addition, target counter 522d is reset to its start value and resumes counting periods in target clock signal 520. Finally, when reference counter 512 has again counted the reset-count value, the whole above-described sequence of read-outs and restarts is repeated.

Count signals 524a-d are applied to a MUX 570 at its input ports, labeled 0, 1, 2, and 3, respectively, in FIG. 5, which MUX is controlled by a control signal 516 generated by reference counter 512. Control signal 516 causes MUX 570 to select one of the signals applied to its input ports and output that signal at its output port as an output signal 574. For example, when reference counter 512 has counted one quarter of the reset-count value, control signal 516 causes MUX 570 to select the signal applied to input port "1" (i.e., count signal 524b generated by target counter 522b). Similarly, when reference counter 512 has counted two quarters of the reset-count value, control signal 516 causes MUX 570 to select the signal applied to input port "2" (i.e., count signal 524c generated by target counter 522c); when reference counter 512 has counted three quarters of the reset-count value, control signal 516 causes MUX 570 to select the signal applied to input port "3" (i.e., count signal 524d generated by target counter 522d); and, when reference counter 512 has counted the reset-count value, control signal 516 causes MUX 570 to select the signal applied to input port "0" (i.e., count signal 524a generated by target counter 522a). Therefore, output signal 574 has, in rotating succession, counts from each of target counters 522a-d.

Subsequent processing of signal 574 implemented in FLD 500 is analogous to the processing of signal 374 implemented in FLD 300. More specifically, signal 574 having the count result of the selected one of target counters 522a-d is applied to the negative input of a comparator 530a, while the positive input of that comparator receives an upper-bound signal 526 having an upper-bound value of the count interval. In addition, signal 574 is applied to the positive input of a comparator 530b, while the negative input of that comparator receives a lower-bound signal 528 having a lower-bound value of the count interval. If the count result provided by signal 574 falls outside the count interval defined by signals 526 and 528, then one of comparators 530a-b generates a binary one. Alternatively, if the count result provided by signal 574 is within the count interval, then both comparators 530a-b generate binary zeros. The output signals generated by comparators 530a-b are then applied to a logic-OR gate 540, which generates lock-indicator signal 550.

Although latency time in FLD 500 is substantially the same as that in a similarly configured FLD 100 (FIG. 1), the throughput rates in these FLDs are different. For example, when each of FLDs 100 and 500 is configured to meet an accuracy constraint of about ±100 ppm and the reference clock signal has a frequency of about 100 MHz, latency time in each FLD is about 100 μs. However, due to the fact that count signal 570 in FLD 500 is updated four times per time interval corresponding to the reset-count value, as opposed to a single update of count signal 124 in FLD 100, the throughput rate in FLD 500 is four times higher than that in FLD 100. More specifically, in the above example, the throughput rates in FLDs 500 and 100 are 40,000 and 10,000 updates per second, respectively. One skilled in the art will appreciate that, in general, an FLD analogous to FLD 500 and having two, three, five, or more staggered target counters can provide an increase of the throughput rate compared to that in FLD 100 in proportion to the number of utilized staggered target counters.

While this invention has been described with reference to illustrative embodiments, this description is not intended to be construed in a limiting sense. Any one of target or reference counters can be an up or down (i.e., counting in an ascending or descending order, respectively) counter. Although embodiments of the invention were described in reference to a multiplication factor of 2.0, other multiplication factors including fractional multiplication factors between 1 and 2 and above 2 can similarly be used. Although embodiments of the invention were described in reference to bi-phased clock signals, other appropriate multi-phased signals can also be used. In a staggered counter configuration, the running counts in the target counters do not need to form an arithmetic progression and, as such, can be separated from one another by increment intervals having two or more different widths. In one embodiment of the invention, an FLD can implement any two or more of the above-described features, e.g., frequency multiplication, count generation based on two or more phases of a signal, and a staggered counter configuration. In addition, a different suitable logic for the comparator circuit can be used. Various modifications of the described embodiments, as well as other embodiments of the invention, which are apparent to persons skilled in the art to which the invention pertains are deemed to lie within the principle and scope of the invention as expressed in the following claims.

The present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. An integrated circuit, comprising:
   a counter circuit adapted to register counts based on a target signal to generate a count value; and
   a control circuit adapted to control the generation of the count value in the counter circuit based on a reference signal, wherein:
      the counter circuit is adapted to register more than one count per period of the target signal and generate the count value based on two or more phases of the target signal;
      the generated count value is related to a frequency difference between the target and reference signals;
      the counter circuit comprises:
         a first target counter adapted to register counts based on occurrences of a first phase of the target signal to generate a first count number;
         a second target counter adapted to register counts based on occurrences of a second phase of the target signal to generate a second count number; and
         a multiplexer adapted to select a value from the first and second count numbers to generate the count value; and
      the control circuit comprises a reference counter adapted to, based on the reference signal, generate a control signal applied to the first and second target counters and to a pointer circuit, wherein the pointer circuit is adapted to control the value selection in the multiplexer based on said control signal.

2. The invention of claim 1, wherein the control circuit comprises a reference counter adapted to, based on the reference signal, generate one or more control signals applied to the counter circuit.

3. The invention of claim 1, wherein:
   the counter circuit comprises a frequency multiplier adapted to multiply the frequency of the target signal to generate an accelerated signal; and
   the count value is generated based on the accelerated signal.

4. The invention of claim 3, wherein:
   the counter circuit further comprises a target counter adapted to generate the count value based on the accelerated signal; and the control circuit is adapted to control the generation of the count value by the target counter.

5. The invention of claim 3, wherein the circuit is adapted to generate the count value based on two or more phases of the accelerated signal.

6. The invention of claim 5, wherein
the first target counter is adapted to register counts based on occurrences of a first phase of the accelerated signal to generate the first count number; and
the second target counter is adapted to register counts based on occurrences of a second phase of the accelerated signal to generate the second count number.

7. The invention of claim 1, wherein the counter circuit is adapted to generate the count value based on registration of at least one redundant count per period of the target signal.

8. The invention of claim 7, wherein the counter circuit comprises two or more target counters, each adapted to register counts based on the target signal, wherein the control circuit is adapted to configure the two or more target counters such that the registered count quantities form an arithmetic progression.

9. The invention of claim 8, wherein the multiplexer is adapted to select a value from the registered count quantities to generate the count value.

10. The invention of claim 9, wherein:
the reference counter is adapted to, based on the reference signal, generate two or more control signals applied to the two or more target counters.

11. The invention of claim 1, further comprising a comparator circuit adapted to compare the generated count value with one or more bound values to quantify the frequency difference.

12. A method of comparing signal frequencies, comprising:
registering counts based on a target signal to generate a count value, wherein more than one count is registered per period of the target signal and the count value is generated based on two or more phases of the target signal; and
controlling the generation of the count value based on a reference signal, wherein the generated count value is related to a frequency difference between the target and reference signals, wherein:
the step of registering comprises:
registering counts based on occurrences of a first phase of the target signal to generate a first count number;
registering counts based on occurrences of a second phase of the target signal to generate a second count number;
applying the first and second count numbers to a multiplexer; and
configuring the multiplexer to select a value from the first and second count numbers to generate the count value; and
the step of controlling comprises, based on the reference signal, generating a control signal applied a pointer circuit, wherein the pointer circuit is adapted to control the value selection in the multiplexer based on said control signal.

13. The invention of claim 12, the step of registering comprises multiplying the frequency of the target signal to generate an accelerated signal, wherein the count value is generated based on the accelerated signal.

14. The invention of claim 13, wherein the count value is generated based on two or more phases of the accelerated signal.

15. The invention of claim 12, wherein the count value is generated based on registration of at least one redundant count per period of the target signal.

16. An integrated circuit, comprising:
a counter circuit adapted to register counts based on a target signal to generate a count value; and
a control circuit adapted to control the generation of the count value in the counter circuit based on a reference signal, wherein:
the counter circuit is adapted to register more than one count per period of the target signal;
the generated count value is related to a frequency difference between the target and reference signals;
the counter circuit comprises:
a frequency multiplier adapted to multiply the frequency of the target signal to generate an accelerated signal;
a first target counter adapted to register counts based on occurrences of a first phase of the accelerated signal to generate a first count number;
a second target counter adapted to register counts based on occurrences of a second phase of the accelerated signal to generate a second count number; and
a multiplexer adapted to select a value from the first and second count numbers to generate the count value;
the count value is generated based on the accelerated signal;
the counter circuit is adapted to generate the count value based on two or more phases of the accelerated signal; and
the control circuit comprises a reference counter adapted to, based on the reference signal, generate a control signal applied to the first and second target counters and to a pointer circuit, wherein the pointer circuit is adapted to control the value selection in the multiplexer based on the control signal.

17. An integrated circuit, comprising:
a counter circuit adapted to register counts based on a target signal to generate a count value; and
a control circuit adapted to control the generation of the count value in the counter circuit based on a reference signal, wherein:
the counter circuit is adapted to register more than one count per period of the target signal and generate the count value based on registration of at least one redundant count per period of the target signal;
the generated count value is related to a frequency difference between the target and reference signals;
the counter circuit comprises:
two or more target counters, each adapted to register counts based on the target signal, wherein the control circuit is adapted to configure the two or more target counters such that the registered count quantities form an arithmetic progression; and
a multiplexer adapted to select a value from the registered count quantities to generate the count value;
the control circuit comprises a reference counter adapted to, based on the reference signal, generate two or more control signals applied to the two or more target counters and an additional control signal applied to the multiplexer; and
the multiplexer is adapted to perform the value selection based on the additional control signal.

* * * * *

UNITED STATES PATENT AND TRADEMARK OFFICE
CERTIFICATE OF CORRECTION

| | | |
|---|---|---|
| PATENT NO. | : 7,489,754 B2 | Page 1 of 1 |
| APPLICATION NO. | : 11/053365 | |
| DATED | : February 10, 2009 | |
| INVENTOR(S) | : Xingdong Dai, Max J. Olsen and Lane A. Smith | |

It is certified that error appears in the above-identified patent and that said Letters Patent is hereby corrected as shown below:

In column 11, line 3 claim 5, replace "wherein the circuit" with --wherein the counter circuit--.

Signed and Sealed this

Twenty-sixth Day of May, 2009

JOHN DOLL
*Acting Director of the United States Patent and Trademark Office*